US 7,876,154 B2
(12) United States Patent  (10) Patent No.: US 7,876,154 B2
Beck                       (45) Date of Patent:    Jan. 25, 2011

(54) VARIABLE GAIN AMPLIFIER HAVING LINEAR-IN-DB GAIN CHARACTERISTIC

(75) Inventor: Sung Ho Beck, Seongnam-si (KR)

(73) Assignee: FCI Inc., Seongnam-si (KR)

( * ) Notice: Subject to any disclaimer, the term of this patent is extended or adjusted under 35 U.S.C. 154(b) by 207 days.

(21) Appl. No.: 12/306,077

(22) PCT Filed: Jun. 14, 2007

(86) PCT No.: PCT/KR2007/002875

§ 371 (c)(1),
(2), (4) Date: Dec. 22, 2008

(87) PCT Pub. No.: WO2008/002026

PCT Pub. Date: Jan. 3, 2008

(65) Prior Publication Data

US 2009/0302946 A1    Dec. 10, 2009

(30) Foreign Application Priority Data

Jun. 30, 2006    (KR) .................. 10-2006-0060301

(51) Int. Cl.
*H03F 3/45* (2006.01)
(52) U.S. Cl. .............. 330/254; 330/278; 330/300; 330/257
(58) Field of Classification Search ............ 330/254, 330/278, 300, 257
See application file for complete search history.

(56) References Cited

U.S. PATENT DOCUMENTS

| 5,886,579 A | * | 3/1999 | Mangelsdorf | 330/253 |
| 5,999,053 A | * | 12/1999 | Eschauzier | 330/254 |
| 6,084,471 A | * | 7/2000 | Ruth et al. | 330/254 |
| 6,215,989 B1 | | 4/2001 | Otaka | |
| 6,563,382 B1 | * | 5/2003 | Yang | 330/254 |
| 6,894,564 B1 | * | 5/2005 | Gilbert | 330/254 |
| 7,737,759 B2 | * | 6/2010 | Gaeta et al. | 327/352 |
| 7,741,909 B2 | * | 6/2010 | Tong et al. | 330/254 |
| 2002/0196080 A1 | | 12/2002 | Saito | |
| 2004/0046608 A1 | | 3/2004 | Komurasaki et al. | |

FOREIGN PATENT DOCUMENTS

JP    2004-200852    7/2004

OTHER PUBLICATIONS

International Search Report, Application No. PCT/KR2007/002875, Dated Sep. 27, 2007.
Written Opinion, Application No. PCT/KR2007/002875, Dated Sep. 27, 2007.

* cited by examiner

*Primary Examiner*—Patricia Nguyen
(74) *Attorney, Agent, or Firm*—Kile Park Goekjian Reed & McManus PLLC

(57)    ABSTRACT

A variable gain amplifier (VGA) with a linear-in-dB gain characteristic is provided. The VGA includes: a control signal converter which converts an input gain control signal $V_C$, which is input so that the VGA obtains a linear-in-dB gain characteristic to the maximum gain, into an output gain control signal $V_x = V_T \ln((1/m)\exp(-V_C/V_T)-1)$ (m is a constant, $V_T = kT/q$); and a variable gain amplifier which receives and converts the output gain control signal $V_x$ output from the control signal converter so that the gain has a linear-in-dB characteristic. A shape of a gain curve is externally controlled.

5 Claims, 2 Drawing Sheets

VARIABLE GAIN AMPLIFIER HAVING LINEAR-IN-DB GAIN CHARACTERISTIC

BACKGROUND OF THE INVENTION

1. Field of the Invention

The present invention relates to a variable gain amplifier (VGA), and more particularly, to a VGA with a linear-in-dB gain.

2. Description of the Related Art

A linear-in-dB gain is required for the usage convenience of a user, when a wide dynamic range is needed like in transmitter and receiver of a CDMA system.

FIG. 1 illustrates an example of a variable gain amplifier (VGA) constructed with a conventional current-controlled variable gain amplifier and a conventional linearity-in-dB control signal converter (CSC).

Signal currents Isig+ and Isig− are input into an emitter of the current-controlled VGA constructed with Q1 to Q4. The input signal currents flow into Iout+ and Iout− due to Vy so as to form an output or flow into the power source.

Amounts of currents flowing into Iout+ and Iout− are dependent on Vy. As the amounts of the current flowing into Iout+ and Iout− increase, the gain of the VGA 120 increases. At this time, a relation between Vy and a VGA gain $A_I$ is shown in Equation 1.

$$A_I = \frac{(Iout+) - (Iout-)}{(Isig+) - (Isig-)} = \frac{1}{1 + \exp\left(\frac{Vy}{VT}\right)} \quad \text{[Equation 1]}$$

As in Equation 1, only when Vy is greater than zero, the current-controlled VGA 120 has a linear-in-dB gain characteristic.

However, an area, in which a gain is large, corresponds to a case where Vy is less than zero. In this case, the current-controlled VGA loses the linear-in-dB gain characteristic. Accordingly, the current-controlled VGA is unavailable. In this case, since the current-controlled VGA is unavailable in the area in which the current-controlled VGA loses the linear-in-dB gain characteristic, the VGA has to be serially connected and used in order to compensate the lost linearity-in-dB. Accordingly, it is disadvantageous in power consumption.

In order to compensate for this, a control signal converter 110 generates $V_Y$ by using an externally given gain control signal $V_{CNT}$ so that the VGA 120 obtains the linear-in-dB gain characteristic to the maximum gain.

A current Icnt generated in response to the gain control signal $V_{CNT}$ generates a voltage drop between bases of Q21 and Q20. When a current flowing through Q20 is $I_0$, collector currents of Q10 and Q11 are respectively determined as $I_0\exp(-g_C RV_{CNT}/VT)$ and $I_0(1-\exp(-g_C RV_{CNT}/V_T)$ due to dB characteristics of the bipolar transistors Q21 and Q20. The result Vy is represented by Equation 2.

$$Vy = V_{BEQ11} - V_{BEQ10} \quad \text{[Equation 2]}$$
$$= V_T \ln\left(\frac{I_0(1-\exp(-g_C RV_{CNT}/V_T)}{I_0\exp(-g_C RV_{CNT}/V_T)}\right)$$
$$= V_T \ln(\exp(g_C RV_{CNT}/V_T) - 1)$$

$$A_I = \frac{1}{1 + \exp\left(\frac{V_y}{VT}\right)} \quad \text{[Equation 3]}$$
$$= \frac{1}{1 + \exp(g_C RV_{CNT}/V_T) - 1}$$
$$= \exp(-g_C RV_{CNT}/V_T)$$

Accordingly, a current gain $A_I$ is represented as $\exp(-g_C RV_{CNT}/V_T)$ as shown in Equation 3 by substituting Equation 2 for $V_Y$ of Equation 1. Accordingly, the VGA can have a linear-in-dB gain characteristic.

However, in a case where $V_Y$ is generated through the method using the VGA of FIG. 1, since large number of bipolar transistors and resistors are used, the area is large. Accordingly, it is difficult to integrate the bipolar transistors and resistors. In addition, since the transistors Q20 and Q21 for generating currents which sensitively influence the gain are not designed as a differential circuit, in practice, the transistors tend to be sensitive to common noise such as a power source end. The performance deterioration due to the common noise is more serious in an integration circuit in which many elements have to be integrated into a small area.

A gain curve of the externally given gain control signal is determined by gc and R. The slope of the gain curve can be changed by externally adjusting gc and R by using switches and the like. However, when the slope is fixed, it is impossible to move the total gain upwardly or downwardly. In addition, when the VGA is used, since the gain of the VGA is different depending on components used in blocks before and behind the VGA, it is necessary to move the total gain upwardly or downwardly.

SUMMARY OF THE INVENTION

The present invention provides a variable gain amplifier (VGA) which can be practically embodied in a small area to enable integration to be easy, the VGA insensitive to common noise which has a linear-in-dB gain characteristic and adjusts a shape of a gain curve based on application of the VGA.

According to an aspect of the present invention, there is provided a variable gain amplifier (VGA) with a linear-in-dB gain, the VGA comprising: a control signal converter which converts an input gain control signal $V_C$, which is input so that the VGA obtains a linear-in-dB gain characteristic to the maximum gain, into an output gain control signal $V_x=V_T\ln((1/m)\exp(-V_C/V_T)-1)$ (m is a constant, $V_T=kT/q$); and a variable gain amplifier which receives and converts the output gain control signal $V_X$ output from the control signal converter so that the gain has a linear-in-dB characteristic, wherein a shape of a gain curve is externally controlled.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in detail with reference to accompanying drawings.

Figure 1:
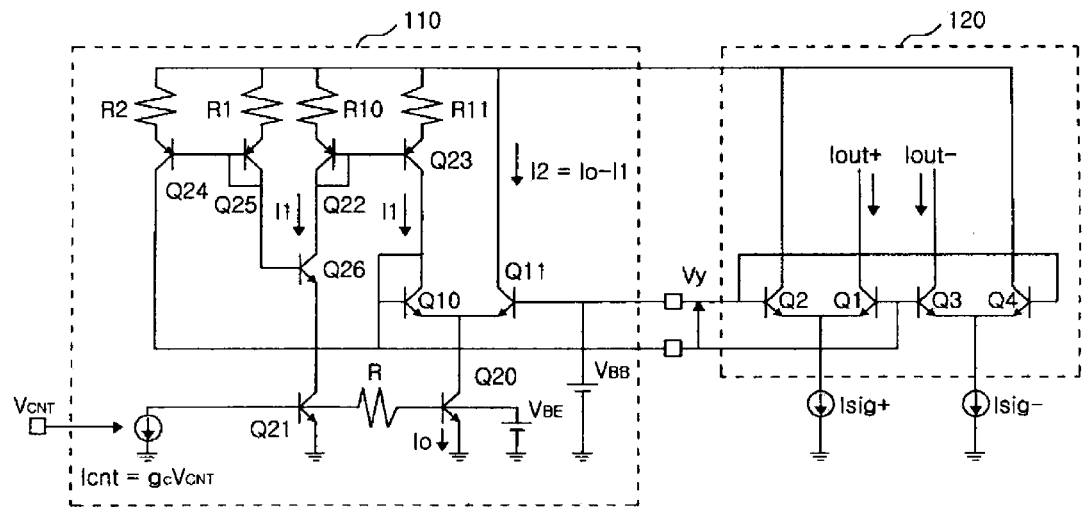
FIG. 1 illustrates a variable gain amplifier (VGA) constructed with a current-controlled VGA that compensates so as to have linear-in-dB gain and a control signal converter according to a conventional technique.
Figure 2:
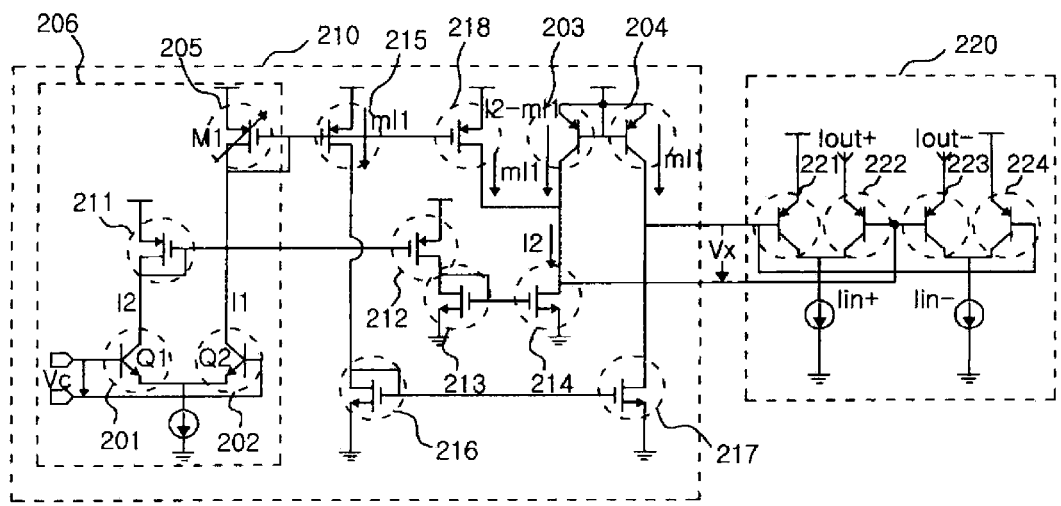
FIG. 2 illustrates a structure of a VGA with a linear-in-dB gain according to an embodiment of the present invention.

FIG. 2 illustrates a structure of a variable gain amplifier (VGA) with a linear-in-dB gain according to an embodiment of the present invention. The VGA is constructed with a control signal converter 210 and a current-controlled VGA 220.

The control signal converter 210 converts an input gain control signal $V_C$ into $V_X$ so that the VGA 220 has a linear-in-dB gain characteristic.

The control signal converter 210 includes: a first bipolar transistor 201 which includes a base connected to a (−) terminal of the input gain control signal and an emitter connected to a current source connected to the ground; a second bipolar transistor 202 which includes a base connected to a (+) terminal of the input gain control signal and an emitter connected to the current source connected to the ground; a first MOS transistor 211 which includes gate and drain commonly connected to a collector of the first bipolar transistor 201 and a source connected to a power source; a first gain control transistor 205 which includes second and third terminals commonly connected to a collector of the second bipolar transistor 202 and a first terminal connected to the power source; a first differential amplifier 206 that is constructed with the first bipolar transistor 201, the second bipolar transistor 202, the first MOS transistor 211, and the first gain controlled transistor 205, in which the base of the first bipolar transistor 201 is applied with the (−) terminal of the input gain control signal, the base of the second bipolar transistor is applied with the (+) terminal of the input gain control signal, the emitters of the first and second bipolar transistors are connected to each other and connected to the current source connected to the ground; a second MOS transistor 212 which includes a gate connected to the gate of the first MOS transistor 211 and a source connected to the power source; a third MOS transistor 213 which includes drain and gate commonly connected to the drain of the second MOS transistor 212 and a source connected to the ground; a fourth MOS transistor 214 which includes a gate connected to the gate of the third MOS transistor 213 and a source connected to the ground; a fifth MOS transistor 215 which includes a gate connected to the second input terminal of the first gain control transistor 205 and a source connected to the power source; a sixth MOS transistor which includes gate and drain commonly connected to the drain of the fifth MOS transistor 215 and a grounded source; a seventh MOS transistor 217 which includes a gate connected to the gate of the sixth MOS transistor 216 and a source is connected to the ground; an eighth MOS transistor 218 which includes a gate connected to the second terminal of the first gain control transistor 205, a source connected to the power source, and a drain connected to the fourth MOS transistor 214; a third bipolar transistor 203 which includes a collector connected to the drain of the eighth MOS transistor 218 and the drain of the fourth MOS transistor 214; and a fourth bipolar transistor 204 which includes a collector connected to the drain of the seventh MOS transistor 217. The emitters and bases of the third and fourth bipolar transistors 203 and 204 are connected to the power source. The collector of the third bipolar transistor 203 is the (+) terminal of the output gain control signal. The collector of the fourth bipolar transistor 204 is the (−) terminal of the output gain control signal. Accordingly, the gain of the current-controlled VGA is controlled.

In a circuit shown in FIG. 2, $V_X$ is converted into $V_C$ through Equation 4 as follows:

$$V_x = V_T \ln\left(\frac{1}{m}\exp\left(-\frac{V_C}{V_T}\right) - 1\right), \qquad \text{[Equation 4]}$$

where m is a constant which depends on the size of the first gain control transistor, $V_T = kT/q$, and q is the coulomb constant that is $1.6*10^{-19}$.

The current controlled VGA 220 has a linear-in-db gain with respect to $V_C$ shown in Equation 5, when $V_X$ that is the output signal of the control signal converter 210 is applied.

$$\begin{aligned}\text{Gain} &= \frac{(Iout+) - (Iout-)}{(Iin+) - (Iin-)} \qquad \text{[Equation 5]}\\ &= \frac{1}{1 + \left(\exp\left(-\frac{V_x}{V_T}\right)\right)}\\ &= m\exp\left(\frac{V_C}{V_T}\right)\end{aligned}$$

In FIG. 2, unlike the conventional technique, the minimum number of bipolar transistors is used, CMOSs are mostly used, and resistors are not used. Accordingly, a practically necessary area is small, and integration is easy. In addition, the first and second bipolar transistors 201 and 202 (Q1 and Q2), which are in an input end, construct a differential amplification circuit. Accordingly, the circuit is less influenced by common noise.

In addition, the VGA 220 of FIG. 2 includes: a fifth bipolar transistor 221 which includes a first terminal connected to the power source, a base connected to the (−) terminal of the output gain control signal, and a second terminal connected to a signal input terminal (+) a sixth bipolar transistor 222 which includes a first terminal connected to a signal output terminal (+), a base connected to the (+) terminal of the output gain control signal, and a second terminal connected to the signal input terminal (+); a seventh bipolar transistor 223 which includes a first terminal connected to the signal output terminal (−), a base connected to the (+) terminal of the output gain control signal, and a second terminal connected to the signal input terminal (−); and an eighth bipolar transistor 224 which includes a first terminal connected to the power source, a base connected to the (−) terminal of the output gain control signal, and a second terminal connected to the signal input terminal (−).

Figure 3:
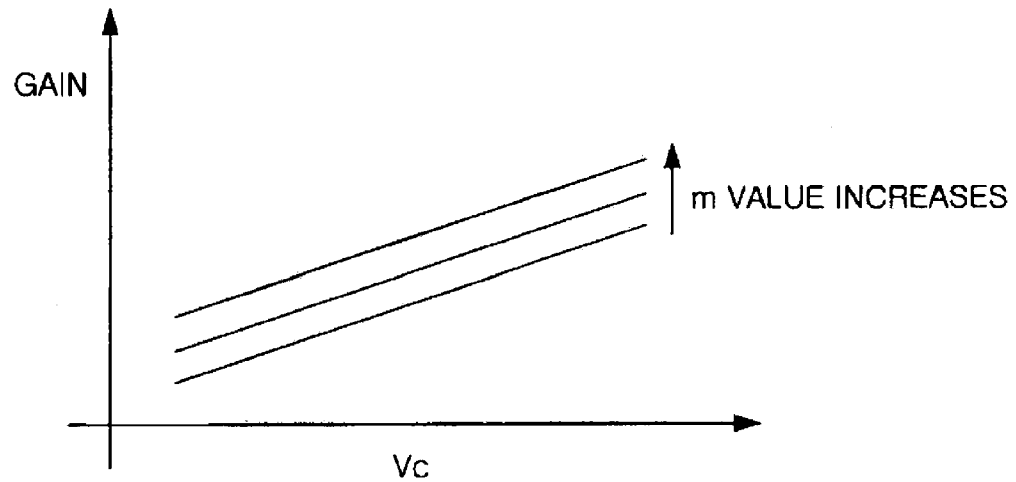
FIG. 3 is a graph illustrating a control of a gain based on a change of an equivalent size of a gain control transistor in a gain control signal converter.

In Equations 4 and 5, the value m is changed by adjusting the size of the gain control transistor 205 (M1). In FIG. 3, the gain also can move upwardly or downwardly by adjusting the size of the gain control transistor 205 (M1).

FIG. 3 is a graph illustrating a variation of the gain due to the constant m.

In a case where the VGA is practically embodied and applied to the entire system, when the gain is changed before and behind the VGA 220 in the entire system, it is possible to use the VGA 220 in an optimal situation by adjusting the size of the gain control transistor M1.

When the VGA is embodied as an integrated circuit, the adjustment of the size of the gain control transistor M1 is easily embodied through a digital control.

Figure 4:
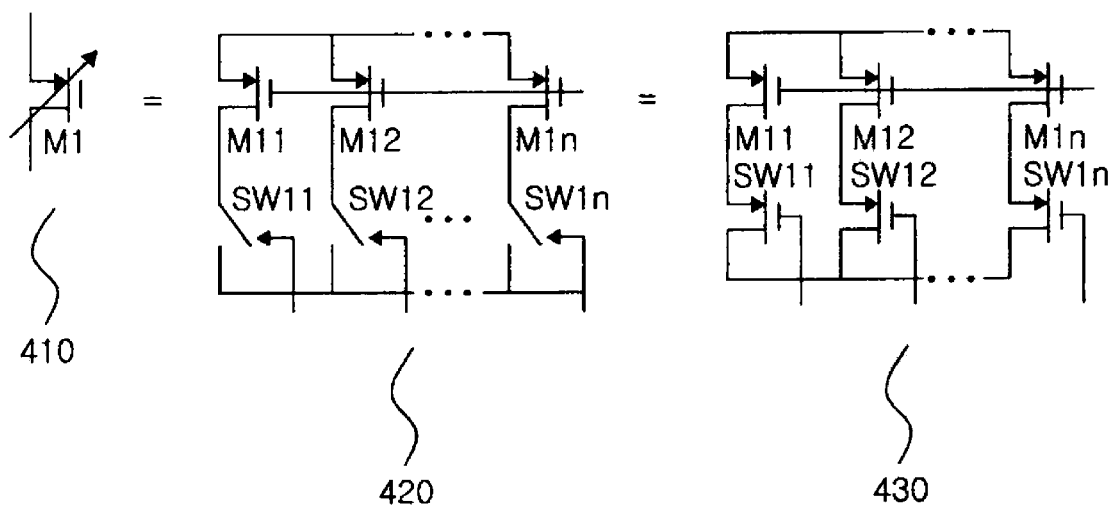
FIG. 4 illustrates a gain control transistor M1 according to an embodiment of the present invention.

FIG. 4 illustrates an equivalent transistor circuit of the gain control transistor M1.

In FIG. 4, referring to a first gain control transistor designated by a reference numeral 420, a first gain control transistor 410 includes: first terminals constructed with sources of commonly connected PMOS transistors; second terminals constructed with gates of the commonly connected PMOS transistors; third terminals constructed with drains of the commonly connected PMOS transistors; and switches which include first terminals connected to the third terminals of the first gain control transistor and second terminals connected to one another. The switches are externally controllable so as to be opened or closed.

Specifically, it is possible to control a size of a transistor by connecting transistors of which gates are connected in parallel with one another and of which sources are connected in parallel with one another with switches sw and adjusting the switches. When the switches are turned on, the size of the equivalent transistor increases, and the constant m decreases. When the switches are turned off, the size of the equivalent transistor decreases, and the constant m increases.

Referring to a first gain control transistor designated by a reference numeral 430, the first terminals of the switches are sources of PMOS transistors. The second terminals of the switches are drains of the PMOS transistors. The switches are easily controlled by adjusting voltages of gates of the PMOS transistors so as to be opened or closed.

According to an embodiment of the present invention, it is possible to improve a linear-in-dB characteristic by inputting an output of a control signal converter obtained by converting an input gain control signal $V_C$ into an output gain control signal $V_x = V_T \ln((1/m)\exp(-V_C/V_T)-1)$ (m is a constant, and $V_T = kT/q$) into a current-controlled variable gain amplifier (VGA). Accordingly, it is possible to integrate elements into a small area. The VGA is insensitive to common noise. When the VGA is applied to a practical system, the VGA can be used in an optimal situation by externally controlling the gain curve.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A variable gain amplifier (VGA) with a linear-in-dB gain, the VGA comprising:
   a control signal converter which converts an input gain control signal $V_C$, which is input so that the VGA has a linear-in-dB gain characteristic to the maximum gain, into an output gain control signal $V_x = V_T \ln((1/m)\exp(-V_C/V_T)-1)$ (m is a constant, $V_T = kT/q$); and
   a variable gain amplifier which receives and converts the output gain control signal $V_X$ output from the control signal converter so that the gain has a linear-in-dB characteristic,
   wherein a shape of a gain curve is externally controlled.

2. The VGA of claim 1, wherein the control signal converter comprises:
   a first bipolar transistor which includes a base connected to a (−) terminal of the input gain control signal and an emitter connected to a current source connected to the ground;
   a second bipolar transistor which includes a base connected to a (+) terminal of the input gain control signal and an emitter connected to the current source connected to the ground;
   a first MOS transistor which includes gate and drain commonly connected to a collector of the first bipolar transistor and a source connected to a power source;
   a first gain control transistor which includes second and third terminals commonly connected to a collector of the second bipolar transistor and a first terminal connected to the power source;
   a first differential amplifier that is constructed with the first bipolar transistor, the second bipolar transistor, the first MOS transistor, and the first gain controlled transistor, in which the base of the first bipolar transistor is applied with the (−) terminal of the input gain control signal, the base of the second bipolar transistor is applied with the (+) terminal of the input gain control signal, the emitters of the first and second bipolar transistors are connected to each other and connected to the current source connected to the ground;
   a second MOS transistor which includes a gate connected to the gate of the first MOS transistor and a source connected to the power source;
   a third MOS transistor which includes drain and gate commonly connected to the drain of the second MOS transistor and a source connected to the ground;
   a fourth MOS transistor which includes a gate connected to the gate of the third MOS transistor and a source connected to the ground;
   a fifth MOS transistor which includes a gate connected to the second input terminal of the first gain control transistor and a source connected to the power source;
   a sixth MOS transistor which includes gate and drain commonly connected to the drain of the fifth MOS transistor and a grounded source;
   a seventh MOS transistor which includes a gate connected to the gate of the sixth MOS transistor and a source is connected to the ground;
   an eighth MOS transistor which includes a gate connected to the second terminal of the first gain control transistor, a source connected to the power source, and a drain connected to the fourth MOS transistor;
   a third bipolar transistor which includes a collector connected to the drain of the eighth MOS transistor and the drain of the fourth MOS transistor; and
   a fourth bipolar transistor which includes a collector connected to the drain of the seventh MOS transistor,
   wherein the emitters and bases of the third and fourth bipolar transistors are connected to the power source, the collector of the third bipolar transistor is the (+) terminal of the output gain control signal, the collector of the fourth bipolar transistor is the (−) terminal of the output gain control signal, and accordingly, the gain of the current-controlled VGA is controlled.

3. The VGA of claim 1, wherein the current-controlled VGA comprises:
   a fifth bipolar transistor which includes a first terminal connected to the power source, a base connected to the (−) terminal of the output gain control signal, and a second terminal connected to a signal input terminal (+);
   a sixth bipolar transistor which includes a first terminal connected to a signal output terminal (+), a base connected to the (+) terminal of the output gain control signal, and a second terminal connected to the signal input terminal (+);

a seventh bipolar transistor which includes a first terminal connected to the signal output terminal (−), a base connected to the (+) terminal of the output gain control signal, and a second terminal connected to the signal input terminal (−); and an eighth bipolar transistor which includes a first terminal connected to the power source, a base connected to the (−) terminal of the output gain control signal, and a second terminal connected to the signal input terminal (−).

4. The VGA of claim 2, wherein the first gain control transistor comprises:

first terminals constructed with sources of commonly connected PMOS transistors;

second terminals constructed with gates of the commonly connected PMOS transistors;

third terminals constructed with drains of the commonly connected PMOS transistors; and switches which include first terminals connected to the third terminals of the first gain control transistor and second terminals connected to one another, wherein the switches are externally controllable so as to be opened or closed.

5. The VGA of claim 4, wherein the first terminals of the switches are sources of PMOS transistors, the second terminals of the switches are drains of the PMOS transistors, and the switches are easily controlled by adjusting voltages of gates of the PMOS transistors so as to be opened or closed.

* * * * *